(12) United States Patent
Kittl

(10) Patent No.: US 7,989,344 B2
(45) Date of Patent: Aug. 2, 2011

(54) METHOD FOR FORMING A NICKELSILICIDE FUSI GATE

(75) Inventor: Jorge Adrian Kittl, Waterloo (BE)

(73) Assignee: IMEC, Leuven (BE)

( * ) Notice: Subject to any disclaimer, the term of this patent is extended or adjusted under 35 U.S.C. 154(b) by 301 days.

(21) Appl. No.: 12/037,486

(22) Filed: Feb. 26, 2008

(65) Prior Publication Data

US 2009/0001483 A1    Jan. 1, 2009

Related U.S. Application Data

(60) Provisional application No. 60/892,074, filed on Feb. 28, 2007.

(51) Int. Cl.
*H01L 21/44* (2006.01)

(52) U.S. Cl. ............ 438/664; 438/682; 257/E23.157

(58) Field of Classification Search .................. None
See application file for complete search history.

(56) References Cited

U.S. PATENT DOCUMENTS

| | | | |
|---|---|---|---|
| 7,511,350 B2* | 3/2009 | Chen et al. ............... | 257/412 |
| 7,618,855 B2* | 11/2009 | Kadoshima et al. ........... | 438/199 |
| 7,786,537 B2* | 8/2010 | Manabe .................. | 257/384 |
| 7,825,025 B2* | 11/2010 | Jain et al. .................. | 438/683 |
| 7,829,461 B2* | 11/2010 | Kawamura et al. ........... | 438/664 |
| 2006/0084247 A1* | 4/2006 | Liu ..................... | 438/510 |
| 2006/0105527 A1* | 5/2006 | Saito ................... | 438/275 |
| 2006/0244045 A1* | 11/2006 | Visokay et al. ............. | 257/315 |
| 2006/0258074 A1* | 11/2006 | Visokay et al. ............. | 438/199 |
| 2006/0258156 A1 | 11/2006 | Kittl | |
| 2007/0023849 A1* | 2/2007 | Yu et al. .................. | 257/412 |
| 2007/0173025 A1* | 7/2007 | Akamatsu .............. | 438/305 |
| 2008/0153241 A1* | 6/2008 | Hsu et al. ............... | 438/305 |
| 2008/0220581 A1* | 9/2008 | Allen et al. ............. | 438/293 |
| 2009/0114993 A1* | 5/2009 | Manabe ............... | 257/369 |

OTHER PUBLICATIONS

Kittl et la., "CMOS Integration of Dual Work Function Phase-Controlled Ni Fully Silicided Gates (NMOS: NiSi, PMOS: Ni2Si and Ni31Si12 on HfSiON," IEEE electron device letters, 27(12):967-968 (Dec. 2006).

Kittl et al., "Work Function of Ni Silicide Phases on HfSiON and SiO2: NiSi, Ni2Si, Ni31Si12 and Ni3Si Fully Silicided Gates," IEEE electron device letters, 27(1):34-36 (Jan. 2006).

* cited by examiner

*Primary Examiner* — Thao Le
(74) *Attorney, Agent, or Firm* — McDonnell Boehnen Hulbert & Berghoff LLP

(57) ABSTRACT

$Ni_3Si_2$ FUSI gates can be formed inter alia by further reaction of $NiSi/Ni_2Si$ gate stacks. $Ni_3Si_2$ behaves similarly to NiSi in terms of work function values, and of modulation with dopants on $SiO_2$, in contrast to Ni-rich silicides which have significantly higher work function values on $HfSi_xO_y$, and negligible work function shifts with dopants on $SiO_2$. Formation of $Ni_3Si_2$ can applied for applications targeting NiSi FUSI gates, thereby expanding the process window without changing the electrical properties of the FUSI gate.

19 Claims, 9 Drawing Sheets

METHOD FOR FORMING A NICKELSILICIDE FUSI GATE

This application claims the priority of U.S. Provisional Patent Application No. 60/892,074, filed Feb. 28, 2007.

BACKGROUND

The present disclosure relates to semiconductor process technology and devices. In particular, it relates to semiconductor devices with metallic gate electrodes formed by a reaction between a metal and a semiconductor material.

Metal gate electrodes are expected to be used in future complementary metal-oxide semiconductor (CMOS) devices in order to address depletion issues of a semiconductor gate electrode and to promote compatibility of the gate electrode with high-k dielectric materials of a gate dielectric. High-k dielectrics are dielectric materials having a relative dielectric constant higher than that of $SiO_2$, typically above 10. For these metal gate electrodes, work function (WF) values of about 4.2 eV and about 5 eV are respectively used for obtaining n-type and p-type gate electrodes in corresponding NMOS and PMOS devices. Metal gate electrodes can be formed by full silicidation (FUSI) of an initial semiconductor gate electrode with a metal in contact therewith. This semiconductor material may be polycrystalline silicon. The metal may be a refractory metal such as W, a noble metal such as Pt, a near noble metal such as Ni, a transition metal such as Ti, or any combination thereof. During this silicidation process, the initial semiconductor gate electrode reacts with the metal and is thereby fully converted into a semiconductor-metal alloy, known as silicide.

Nickel (Ni) fully silicided (FUSI) gate electrodes have recently attracted attention as candidates for metal gate electrodes. Initial studies focused on $Ni_1Si_1$ (or NiSi) and the ability to modify the effective work function of NiSi FUSI gate electrodes when formed on $SiO_2$ or SiON gate dielectrics with dopants to obtain either an n-type or p-type work function. Elements such as As, P or B are then incorporated in the NiSi gate electrode. It was found that dopants implanted into the polysilicon gate electrode before silicidation segregate during silicidation to the interface between the gate electrode and the gate dielectric. This dopant segregation resulted in a significant pile-up of the dopants at this interface after full silicidation.

Recently, the focus shifted to include other Ni silicide phases such as $Ni_2Si$ and $Ni_{31}Si_{12}$ to form a fully silicided gate electrode. Compared to a NiSi fully silicided gate electrode, these other Ni silicide phases, with a ratio Ni to Si that is higher than 1, were found to yield a fully silicided gate electrode with a higher work function compared to a NiSi fully silicided gate electrode when formed on a $HfSi_xO_yN_z$ dielectric layer. These Ni-rich phases are thus more attractive for fabricating p-type gate electrodes. However, these other Ni-rich silicide phases exhibited no significant work function modulation with dopants when formed on a $SiO_2$ dielectric layer, despite the fact that a similar interfacial pile-up of dopants was observed on the interface between a Ni-rich silicided gate electrode with the gate dielectric in case a $SiO_2$ or $HfSi_xO_yN_z$ was used as a dielectric material.

CMOS integration schemes using different Ni silicide phases for respectively n-MOS, e.g. NiSi, and p-MOS, e.g. $Ni_2Si$ or $Ni_{31}Si_{12}$, taking advantage of the differences in work function of these nickel silicide phases on $HfSi_xO_yN_z$, have been demonstrated. J. Kittl et al. discloses in "CMOS Integration of Dual Work Function Phase-Controlled Ni Fully Silicided Gates (NMOS: NiSi, PMOS:$Ni_2Si$ and $Ni_{31}Si_{12}$) on HfSiON", IEEE electron device letters Vol. 27, No 12 (December 2006), p. 967-968, such an integration scheme for fabricating CMOS devices with different work function for NMOS and PMOS device using different nickel silicide phases for each device type.

The substantial difference in work function among these Ni silicide phases when formed on an $HfSi_xO_yN_z$ gate dielectric, and in their work function dependency on doping when formed on a $SiO_2$ gate dielectric also implies the need to control the silicide phase formation in order to ensure good control and uniformity of the resulting device threshold voltages. J. Kittl et al discloses in "Work Function of Ni Silicide Phases on HfSiON and SiO2: NiSi, $Ni_2Si$, $Ni_{31}Si_{12}$ and $Ni_3Si$ Fully Silicided Gates", IEEE electron device letters Vol. 27, No 1, January 2006, p 34-36, an optimized two-step Rapid Thermal Processing (RTP) nickel silicidation process wherein the reacted Ni to Si ratio was controlled by selecting the thermal budget of the first RTP step thereby allowing the control of nickel silicide phase obtained during the silicidation process.

The applicability of Ni fully silicided gates may be limited, among other factors, by the ability to control the reacted Ni-to-Si ratio and hence to control the resulting silicide phase present at the interface with the gate dielectric, where the silicide phase determines the gate electrode work function. Furthermore, although NiSi is used to fabricate fully nickel silicided gate electrodes, the process window, in terms of as-deposited Ni-to-Si ratio and/or thermal budget of the silicidation process, for forming NiSi is limited.

SUMMARY

Methods of fabricating a nickel fully-silicided-gate electrode device are disclosed. One such method comprises: providing a MOSFET device (1) having a silicon gate electrode (5) formed on a gate dielectric (4); providing a nickel layer (12) in contact with the semiconductor gate electrode (5); and performing a silicidation process to form $Ni_3Si_2$ silicide (15) at least at the interface between the gate electrode (5) with the gate dielectric (4).

Another method of fabricating a nickel fully-silicided-gate electrode device, is disclosed. The method comprises: providing a MOSFET device (1) having a silicon gate electrode (5) formed on a gate dielectric (4); providing a nickel layer (12) in contact with the semiconductor gate electrode (5); and performing a silicidation process to form $Ni_3Si_2$ silicide (15) at least at the interface between the gate electrode (5) with the gate dielectric (4). In this embodiment, the silicidation process comprises: performing a first thermal process step to have the semiconductor gate electrode (5) react with the provided nickel (12) thereby forming a gate electrode stack comprising NiSi (13) and a metal-rich silicide phase (14), preferably $Ni_2Si$, selectively removing unreacted nickel (12); and performing a second thermal process step to have the gate electrode stack comprising NiSi (13) and a metal-rich silicide phase (14) converted into a $Ni_3Si_2$ silicide phase (15). The method can further comprise incorporating dopants such as P and/or B in the $Ni_3Si_2$ silicide phase (15) to modulate the work function thereof Preferably the gate dielectric is silicon-oxide or a hafnium based dielectric such as hafnium-oxy-silicate.

Yet another method of fabricating a nickel fully-silicided-gate electrode device, is disclosed. This method comprises: providing a MOSFET device (1) having a silicon gate electrode (5) formed on a gate dielectric (4); providing a nickel layer (12) in contact with the semiconductor gate electrode (5); and performing a silicidation process to form $Ni_3Si_2$ silicide (15) at least at the interface between the gate electrode (5) with the gate dielectric (4). This method can further comprise incorporating dopants such as P and/or B in the $Ni_3Si_2$ silicide phase (15) to modulate the work function thereof Preferably the gate dielectric is silicon-oxide or a hafnium based dielectric such as hafnium-oxy-silicate.

A MOSFET (1) is disclosed comprising a gate electrode (5) and a gate dielectric (4), wherein the gate electrode (5) comprises at least $Ni_3Si_2$ (15) at least at the interface with the gate dielectric (4). The $Ni_3Si_2$ (15) of this MOSFET device (1) can further comprises dopants, such as P and/or B for modulating the work function thereof.

Preferred embodiments of the present disclosure provide a substitute material for NiSi as metal gate electrode, where the substitute material has a work function behavior comparable to NiSi.

Preferably, such a substitute can be formed in a process window adjacent to the process window for fabricating a NiSi metal gate electrode. In particular, it is preferable that process control requirements can be alleviated using embodiments in which a NiSi or NiSi-like metal gate electrode can be obtained over a larger range of process parameters.

In some embodiments, a stable nickel Fully Silicided gate electrode is provided using this NiSi substitute material at low processing temperatures.

Preferably a nickel fully silicided gate electrode is provided having an n-type work function on Hafnium-based gate dielectrics and a work function on silicon-oxide or silicon-oxy-nitride gate dielectrics that can be modulated by dopants.

BRIEF DESCRIPTION OF THE DRAWINGS

Exemplary embodiments are illustrated in referenced figures of the drawings. The embodiments and figures disclosed herein must be considered illustrative rather than restrictive. The drawings described are only schematic and are non-limiting. In the drawings, the size of some of the elements may be exaggerated and not drawn on scale for illustrative purposes and do not necessarily correspond to actual reductions to practice. Same numerals are used to refer to corresponding features in the drawings

DETAILED DESCRIPTION

Figure 1:
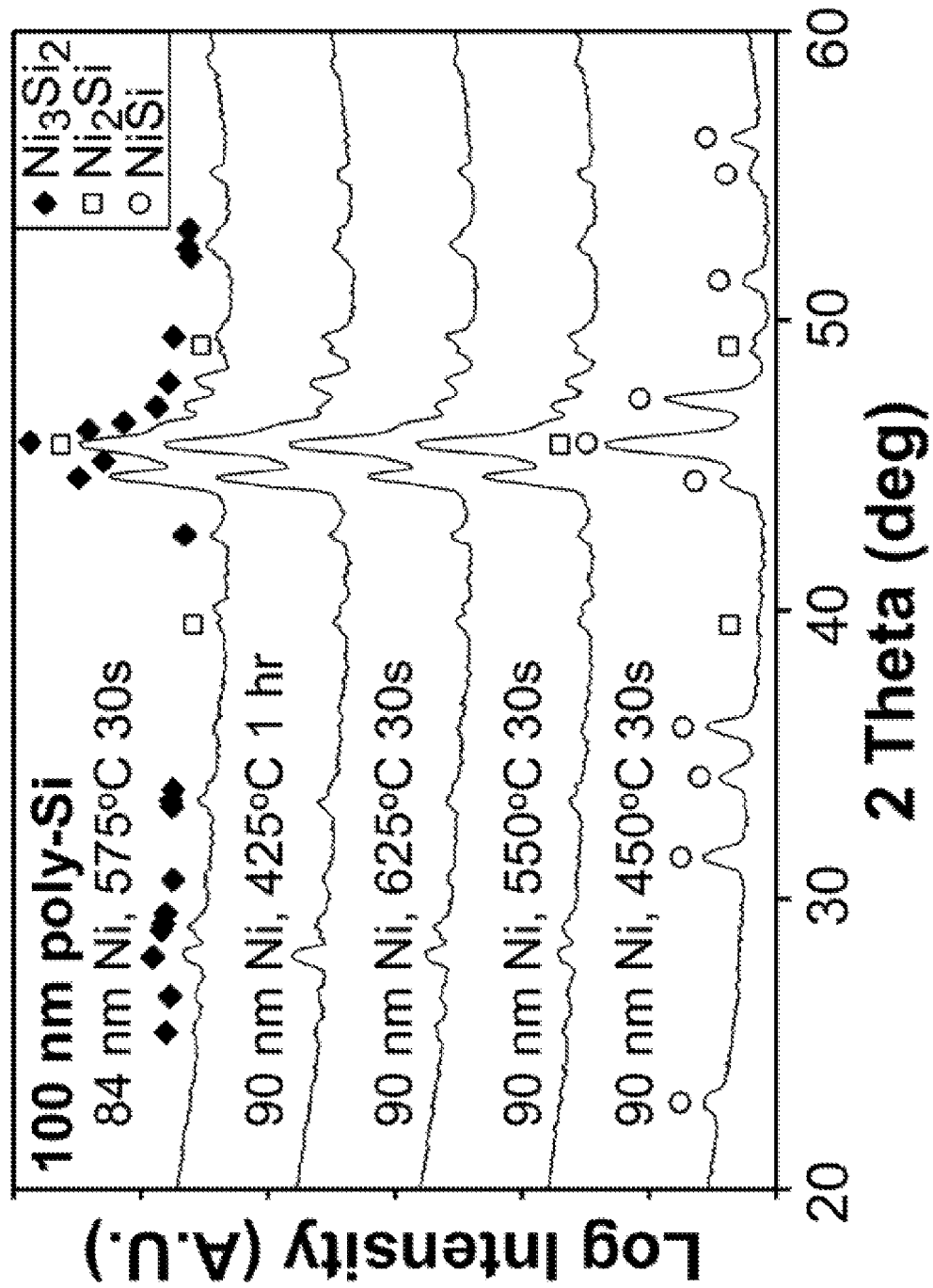
FIG. 1 shows X-Ray Diffraction patterns (XRD) (Cu $K_\alpha$ radiation), intensity in Arbitrary Units (A.U.), versus angle 2 Theta (deg), of silicide films formed by a single Rapid Thermal Processing (RTP1) reaction of 84 or 90 nanometer (nm) Ni with 100 nm poly-Si formed on a $SiO_2$ layer for different RTP thermal budgets, i.e. combinations of RTP1 temperature (° C.) and RTP time (s).

In the present disclosure, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description. Such methods are known to a person skilled in the art.

In the framework of the present disclosure, the terms "silicide", "silicided", "silicidation" can refer to the reaction between a metal and silicon, but is not intended to be limited to silicon. For instance, the reaction of a metal with SiGe, Ge, or any other suitable semiconductor material, may still be referred to as silicidation.

For selected metal-semiconductor alloys, i.e. silicides, the work function thereof may depend on the specific phase in which the alloy is formed. Hence, the suitability of such metal-semiconductor combinations for use as gate electrode for one type of transistor depends on which phase of this metal-semiconductor combination can be formed for this type of transistor and/or if the work function of this phase can be modulated by incorporating dopants therein. This specific phase is to be formed at least at the bottom part of the gate electrode (the part nearest to the gate dielectric), referred to herein as the interface. This specific phase may be formed within the bottom few nanometers of the gate electrode, e.g., the last nanometer, or the last 2, 3, 4, 5, 10 nanometers or more.

In other words, in the context of the present disclosure, the term "interface," when referring to the specific silicide phase of the gate electrode, refers to the bottom part of the gate electrode, which is the nearest to the gate dielectric, of few nanometers thickness, e.g. between about 1 nm and about 10 nm, preferably between about 1 nm and about 5 nm.

This specific silicide phase, also referred to as metal-semiconductor phase, can be represented by the formula $M_xS_y$, wherein M represents the metal, S represents the semiconductor and wherein x and y are integers or real numbers different from 0. In a metal-rich silicide, x/y is larger than 1. The numbers x and y thus refer to the ratios of the reacted metal and semiconductor.

More particularly, with regard to nickel silicide, for metal-rich phases such as $Ni_2Si$, $Ni_3Si_2$, $Ni_{31}Si_{12}$, or $Ni_3Si$, the composition ratio x/y is higher than 1 and preferably less than or equal to about 3 (i.e. $1<x/y\leq3$), while for metal-poor phases such as NiSi or $NiSi_2$, the ratio x/y is higher than 0 and less than or equal to about 1 (i.e. $0<x/y\leq1$).

In the content of the present disclosure, the ratio nickel-to-silicon can be indicated as the composition ratio x/y or as the thickness ratio $t_{Ni}/t_{Si}$ of the as-deposited nickel and silicon layers. The relationship between both ratios is the density of the respective layers. A thickness ratio nickel-to-silicon of 1 corresponds to a composition ratio of about 1.6.

In contrast to other stable low temperature nickel silicide phases, $Ni_3Si_2$ has received little attention to date. It can be formed as a stable phase in the normal phase sequence for Ni-to-Si composition ratios x/y between 1 and 2.

Figure 6:
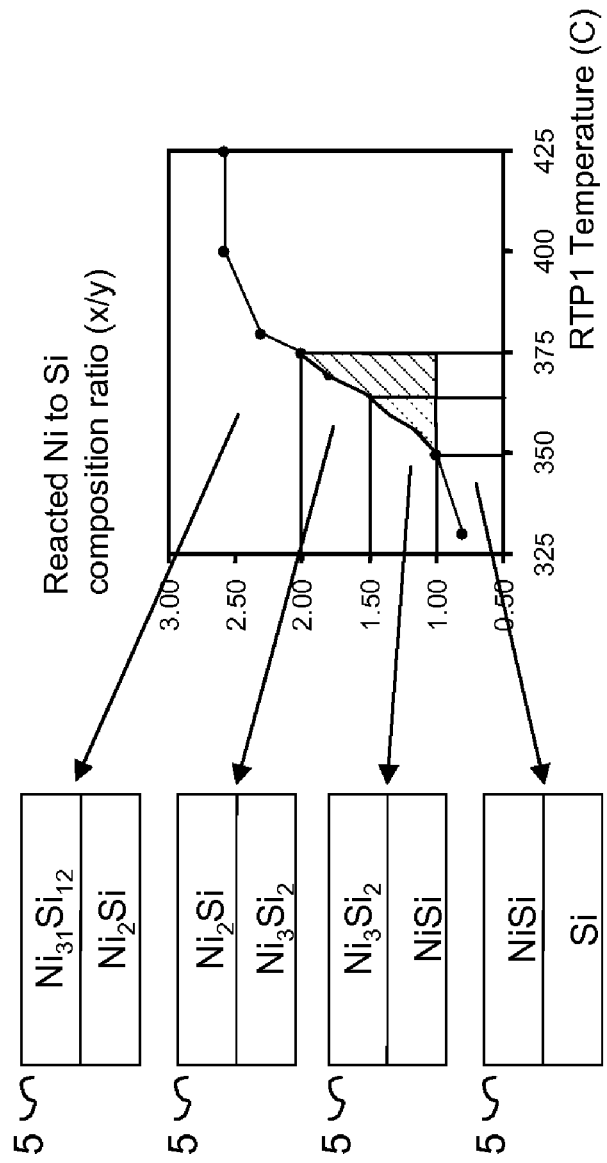
FIG. 6 shows the nickel silicide phase formation as function of the thermal budget of the first RTP1 step (temperature (° C.) for 30 s anneal time) and as function of composition ratio Ni-to-Si (x/y).

In the case of a composition ratio x/y of about 2, a stack of NiSi and $Ni_2Si$ is formed first whereby NiSi is in contact with the gate dielectric and $Ni_2Si$ is on top of the NiSi. Thereafter, upon applying thermal energy, $Ni_3Si_2$ will grow by the reaction $NiSi+Ni_2Si \rightarrow Ni_3Si_2$. This reaction occurs at moderate thermal budgets, e.g. at a high enough RPT2 temperature or by using additional high enough thermal budget provided during subsequent processing. The conversion to $Ni_3Si_2$ will generally be driven to completion with thermal budgets used in back-end of line CMOS processing, such as at temperatures below 400° C. for sufficient time periods, e.g. 30 minutes, thereby fully consuming the reactant phase that is present initially in a smaller amount. Full consumption of the NiSi layer by $Ni_3Si_2$ formation defines in consequence the upper limit in Ni content incorporated in the gate electrode during the first silicidation step, e.g., limiting the first RTP (RTP1) thermal budget when Ni availability does not limit the reaction between silicon and nickel. Such abundance of nickel occurs in particular for small patterned structures. The first thermal budget of the silicidation process is therefore preferably chosen to form a stack of NiSi and $Ni_2Si$, the ratio between both silicide phases in the stack being determined by the thermal budget and nickel-to-silicon composition ratio: the higher the thermal budget of RTP1 and/or the more as-deposited nickel being available for silicidation during RPT1, the more $Ni_2Si$ is formed compared to NiSi. Given the narrow process window found for NiSi FUSI gates, as shown in FIG. 6 (350° C.<RTP1<360° C. if NiSi is to be formed at the interface with the gate dielectric), it is important to understand what work function is expected if $Ni_3Si_2$ is formed at the interface with the dielectric. In addition, given the different behavior between NiSi and the Ni-rich silicides such as $Ni_2Si$, $Ni_{31}Si_{12}$ and $Ni_3Si$ both on $SiO_2$ and on Hf silicates gate dielectrics, it is of interest to compare the behavior of $Ni_3Si_2$ to that of the other Ni silicides.

In this application, the characterization of the effective work function of $Ni_3Si_2$ on $SiO_2$ including the effect of dopants, and on $HfSi_xO_y$ including the dependency on the Hf content of the hafnium-based dielectric is disclosed. In the embodiment illustrated by FIGS. 1 to 4, a single RPT silicidation process was used to form the $Ni_3Si_2$.

Ni FUSI capacitors were fabricated on (100) p-type Si. Dielectric thickness series were used for accurate work function extraction accounting for charge effects. A 10-nm high-quality thermal $SiO_2$ was first grown at 900° C. on 200 mm wafers using shallow-trench isolation to isolate active areas. A slant etching technique was then used, where $SiO_2$ is selectively wet etched to obtain a gradual thickness variation in the 4-7 nm range across each wafer. On selected wafers, $HfSi_xO_y$ films of different thicknesses (2, 3, 4 and 6 nm) and different Hf contents (Hf/(Hf+Si)=23, 40 and 60 at %) were subsequently deposited by metal-organic chemical vapor deposition. Deposition of 100 nm polycrystalline silicon (poly-Si) followed, with selected wafers receiving either B (3 keV, $6\times10^{15}$ cm$^{-2}$) or P (8 keV, $4\times10^{15}$ cm$^{-2}$) ion implantation. All wafers received a 1050° C. spike anneal. Ni films in the 60-145 nm thickness range were then deposited and reacted by a single RTP1 step to form nickel silicides at temperatures in the 425-625° C. range. Unreacted Ni was then removed in a selective etch. Materials characterization included X-ray diffraction (XRD), and Rutherford Backscattering Spectrometry (RBS), scanning and transmission electron microscopy. The thus formed structures were subjected to a 420° C. 20 min forming gas anneal. Capacitance-voltage (C-V) measurements were performed on these annealed structures.

NiSi, $Ni_2Si$ and $Ni_{31}Si_{12}$ FUSI gates were formed for deposited Ni thicknesses of 60, 120 and 145 nm on the 100 nm poly-Si and single RTP1 temperatures of 550° C., 425° C. and 480° C. respectively (30 s). Process conditions for formation of the FUSI gates were optimized to ensure the presence of the target phase as dominant phase at the dielectric interface.

Phase formation of $Ni_3Si_2$ is illustrated in FIG. 1. For 90 nm Ni films (Ni—Si composition ratio slightly >1.5) and single RTP1 of 450° C. 30 s, XRD peaks corresponding to NiSi (circles) and $Ni_2Si$ (squares) are observed. The resulting silicide film is a stack of NiSi with $Ni_2Si$ on top. For RTP1 of 550° C. 30 s, the XRD pattern corresponds to $Ni_3Si_2$ (diamonds). Small $Ni_2Si$ peaks are also observed indicating the presence of this secondary phase (note the logarithmic scale on the ordinate axis of FIG. 1), as expected for the chosen Ni—Si ratio of slightly >1.5. NiSi peaks have disappeared indicating the $Ni_3Si_2$ formation has fully consumed this phase. We note that if a slightly Ni deficient ratio had been chosen (composition ratio x/y<1.5), NiSi could remain at the interface with the gate dielectric and the work function could be still controlled by this NiSi phase. Similar XRD patterns are observed for higher thermal budgets, e.g. at higher RPT1 temperatures (625° C., 30 s) or for longer furnace anneals at lower temperatures (425° C., 1 hr). The latter thermal budget is comparable to those used in CMOS back end processing and confirms that the reaction to form $Ni_3Si_2$ is driven to completion in this case even if an incomplete conversion into $Ni_3Si_2$ is obtained during the silicidation process. A smaller amount of the $Ni_2Si$ impurity phase is observed when 84 nm Ni is deposited on the 100 nm poly-Si (Ni—Si composition ratio x/y slight <1.5) and reacted at an RTP1 of 575° C. 30 s.

Figure 2A:
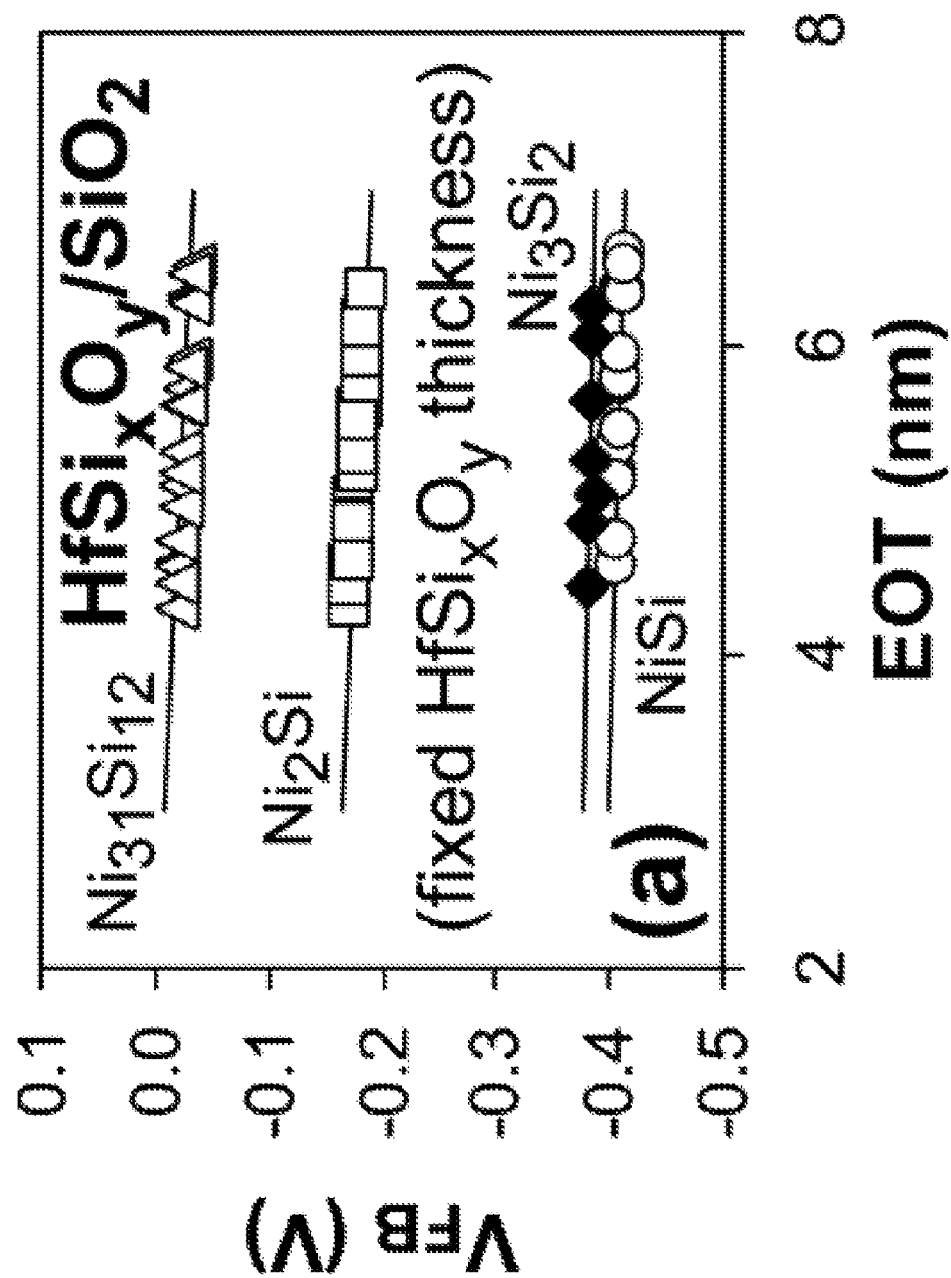
FIG. 2 shows Flatband Voltage ($V_{FB}$) (V) versus Equivalent Oxide Thickness EOT (nm) of undoped FUSI gate electrodes formed on $HfSi_xO_y/SiO_2$ gate dielectric stacks, for (a) NiSi, $Ni_3Si_2$, $Ni_2Si$ and $Ni_{31}Si_{12}$, whereby the ratio Hf/(Hf+Si)=40 at. % with fixed $HfSi_xO_y$ thickness and varying $SiO_2$ thicknesses; and (b) $Ni_3Si_2$, whereby the ratio Hf/(Hf+Si)=40 and 60 at. % with varying $HfSi_xO_y$ thickness and fixed $SiO_2$ thicknesses.
Figure 2B:
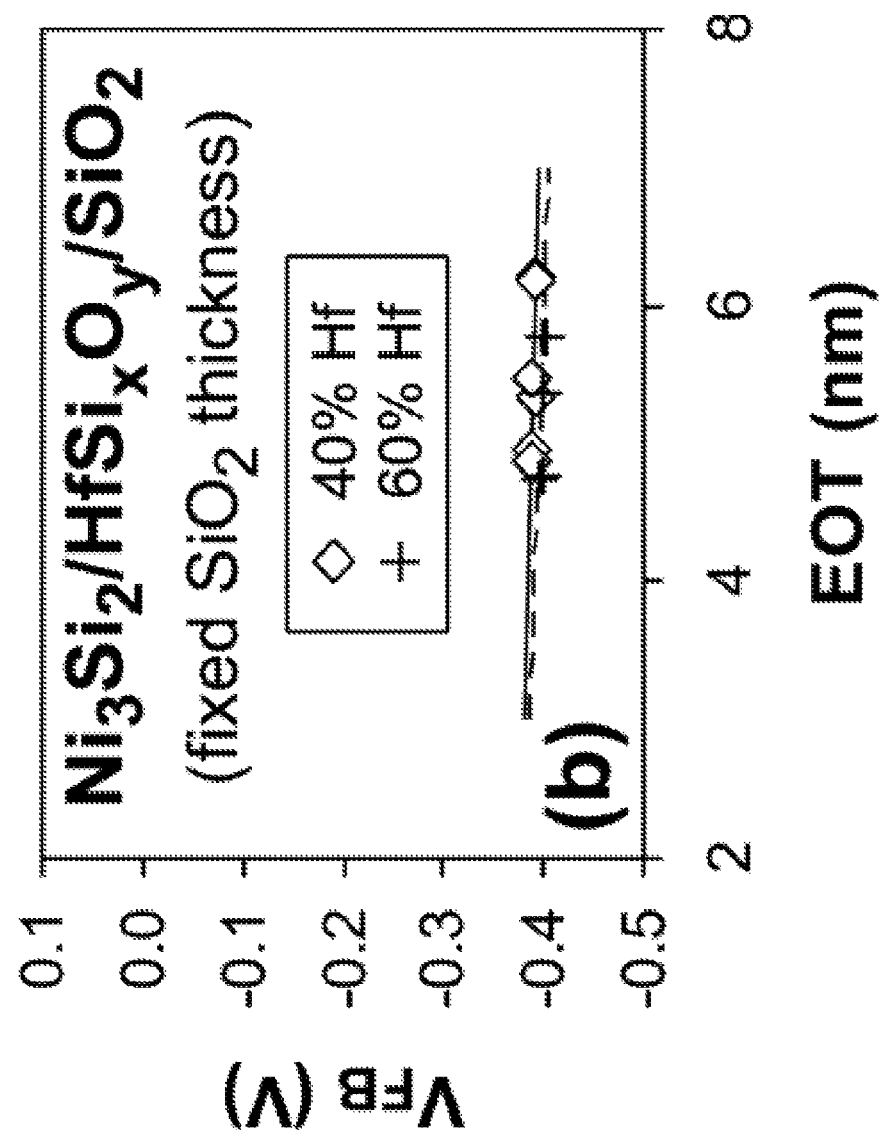

C-V measurements were performed on $Ni_3Si_2$, NiSi, $Ni_2Si$ and $Ni_{31}Si_{12}$ undoped FUSI capacitors formed on $HfSi_xO_y/SiO_2$ gate dielectric stacks. Equivalent Oxide Thickness (EOT) and Flat-Band voltages ($V_{FB}$) were obtained using the Hauser routine. Process conditions chosen for the $Ni_3Si_2$ capacitors were 90 nm Ni annealed at 550° C. 30 s. FIGS. 2a-b show $V_{FB}$ vs. EOT plots for these nickel silicide phases. FIG. 2(a) corresponds to fixed $HfSi_xO_y$ thickness, Hf/(Hf+Si) =40%, and varying $SiO_2$ thickness; and FIG. 2(b) corresponds to fixed $SiO_2$ thickness and varying $HfSi_xO_y$ thickness for Hf contents of 40 and 60%. The fixed charge density ($Q_f$) at the $SiO_2$/substrate interface, of $\sim 1\times 10^{11}$ cm$^{-2}$ is similar for the different silicide phases as in FIG. 2(a) the slope of the $V_{FB}$ vs. EOT is comparable for all different silicide phases. Charge contributions from the $HfSi_xO_y$ films and the $HfSi_xO_y/SiO_2$ interfaces are negligible, as seen in FIG. 2(b), where charge effects affecting the $V_{FB}$ vs. EOT plots are similar to those found when only the $SiO_2$ thickness is varied, indicating that the behavior is still dominated by fixed charges at the $SiO_2$/Si interface.

Figure 3:
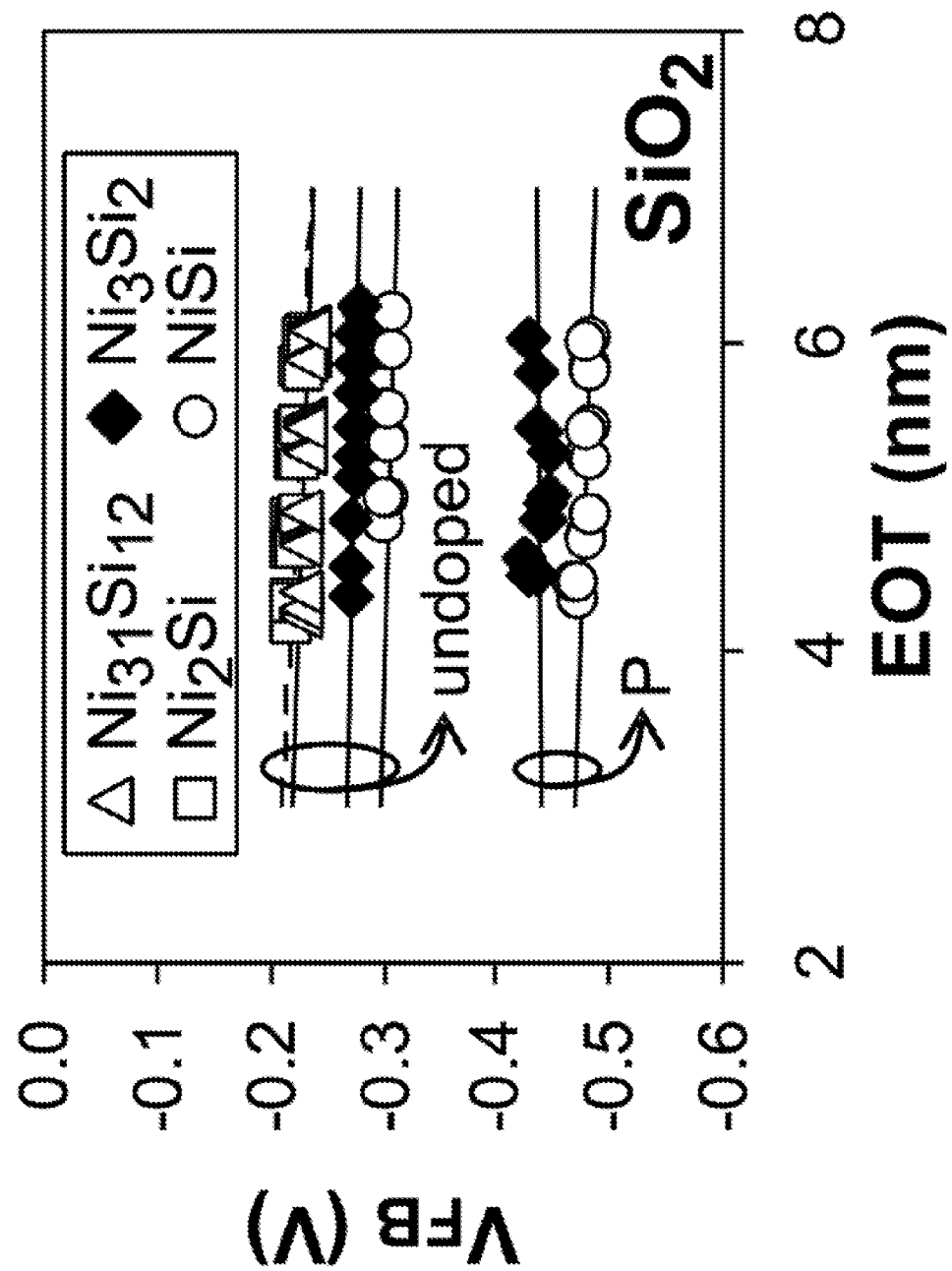
FIG. 3 shows Flatband Voltage ($V_{FB}$) (V) versus Equivalent Oxide Thickness (EOT) (nm) for undoped NiSi, $Ni_3Si_2$, $Ni_2Si$ and $Ni_{31}Si_{12}$ FUSI gate electrodes formed on a $SiO_2$ gate dielectric, and for P-doped NiSi and $Ni_3Si_2$ FUSI gate electrodes formed on a $SiO_2$ gate dielectric.

C-V measurements were performed on undoped $Ni_3Si_2$, NiSi, $Ni_2Si$ and $Ni_{31}Si_{12}$ FUSI capacitors and on P-doped $Ni_3Si_2$ and NiSi FUSI capacitors. The FUSI capacitors are formed on a $SiO_2$ gate dielectric. Equivalent oxide thickness (EOT) and flat-band voltages ($V_{FB}$) were obtained using the Hauser routine. Process conditions chosen for the $Ni_3Si_2$ capacitors were 90 nm Ni annealed at 550° C. 30 s. FIG. 3 show $V_{FB}$ vs. EOT plots for these phases. The flatband voltage of both $Ni_3Si_2$ and NiSi FUSI capacitors is shifted over about the same range by incorporating dopants in the silicide phase, thereby illustrating that the work function of a $Ni_3Si_2$ gate electrode can be modulated by doping thereof Moreover the dependency of the work function of a $Ni_3Si_2$ gate electrode on doping is similar to a NiSi gate electrode.

Figure 4:
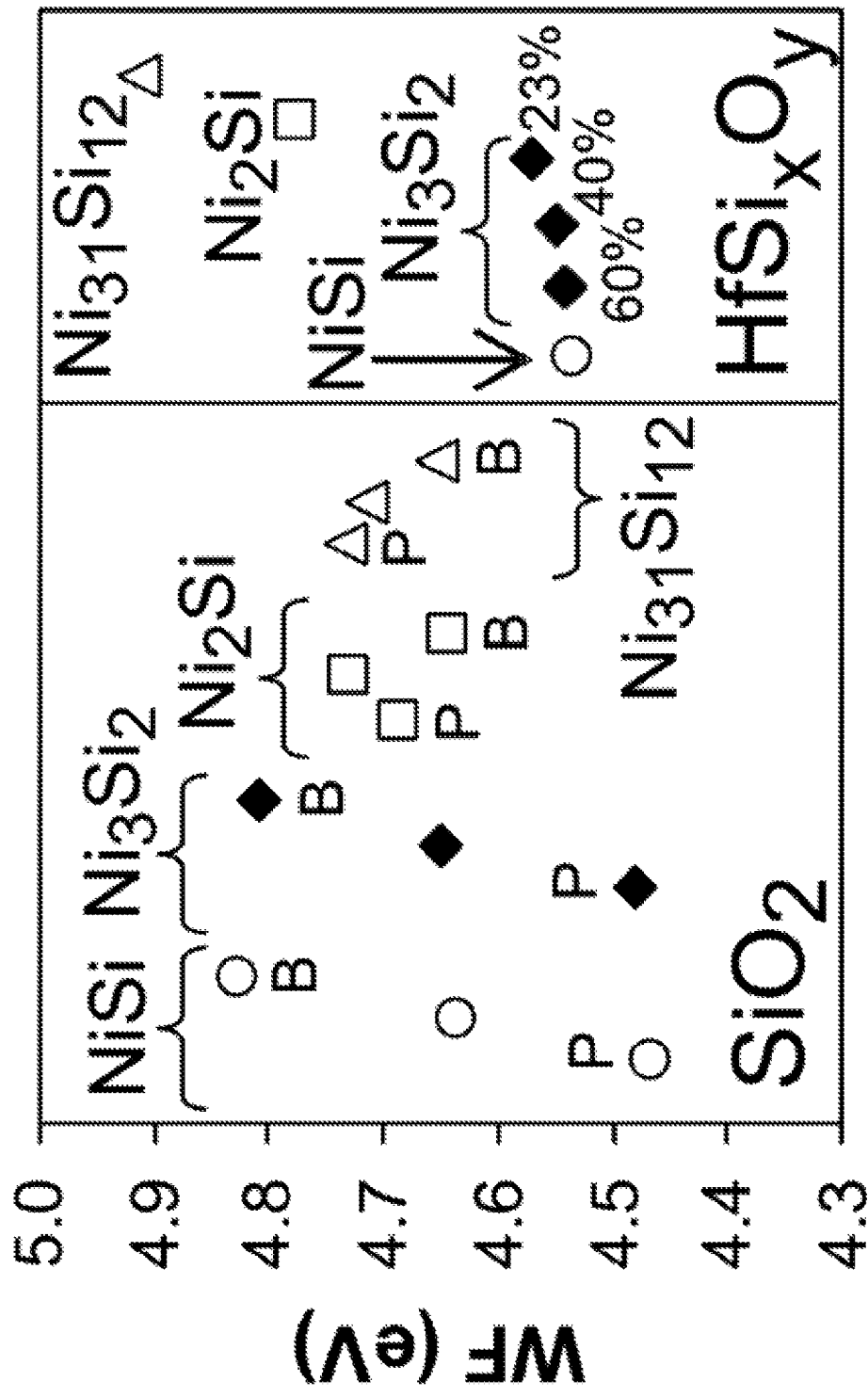
FIG. 4 shows Work Function (WF) (eV) of NiSi, $Ni_2Si$, $Ni_3Si_2$ and $Ni_{31}Si_{12}$ FUSI gate electrodes on $SiO_2$ (left) and $HfSi_xO_y$ (right) gate dielectrics. The FUSI gate electrodes formed on a $SiO_2$ gate dielectric are doped showing the effect of P and B dopants on the work function of the gate electrode. The $Ni_3Si_2$ FUSI gate electrode is formed on $HfSi_xO_y$ gate dielectrics with varying Hf content (Hf/(Hf+Si)=23, 40 and 60 at. %). The Hf content of the $HfSi_xO_y$ gate dielectric for the NiSi, $Ni_2Si$ and $Ni_{31}Si_{12}$ FUSI gate electrode was Hf/(Hf+Si)=40 at. %.

Effective work function extracted from the thickness series are shown in FIG. 4. The work function of NiSi, $Ni_2Si$, $Ni_3Si_2$ and $Ni_{31}Si_{12}$ FUSI gates on $SiO_2$ (left) and $HfSi_xO_y$ (right) dielectrics is plotted. When P or B doping NiSi and $Ni_3Si_2$ FUSI gate electrodes formed on a $SiO_2$ gate dielectric, the work function was shifted considerably in an almost similar way. For $Ni_2Si$ and $Ni_{31}Si_{12}$ FUSI gate electrodes on a $SiO_2$ gate dielectric, the work function remains essentially unaffected by the P or B doping. The addition of dopants (P or B) before silicidation thus results in a modulation of the work function of $Ni_3Si_2$ on $SiO_2$ similar to the work function modulation observed for NiSi. In contrast, significantly reduced work function shifts with doping are seen for Ni-rich silicides.

The dependency of the work function of a $Ni_3Si_2$ FUSI gate electrode formed on a $HfSi_xO_y$ gate dielectric on the Hf content of this gate dielectric is also plotted. The Hf content (=Hf/(Hf+Si)) was set at 23, 40 and 60 at. % for the $Ni_3Si_2$ FUSI gate electrode on $HfSi_xO_y$. The Hf content for the NiSi, $Ni_2Si$ and $Ni_{31}Si_{12}$ gates on $HfSi_xO_y$ was set Hf/(Hf+Si)=40 at. %. The work function of $Ni_3Si_2$ is close to that of NiSi on $HfSi_xO_y$ and has little dependence on the Hf content within the range studied. Higher work function values are seen for the Ni-rich silicides on $HfSi_xO_y$. Again a similar behavior is observed for NiSi and $Ni_3Si_2$ FUSI gate electrode, in contrast to other Ni-rich silicides.

Since the $Ni_3Si_2$ phase grows after a $NiSi/Ni_2Si$ stack is formed, with NiSi at the interface with the dielectric, the gate electrodes have initially a structure and work function corresponding to NiSi FUSI gates including the pile-up of dopants at the dielectric interface if dopants are used. The results presented here suggest that the structure of the initial NiSi gate electrode/gate dielectric interface is not significantly modified by the growth of $Ni_3Si_2$. Thus, a similar dipole layer, resulting from the pile-up of dopants at the dielectric interface, may be responsible for the work function modulation on $SiO_2$ of both NiSi and $Ni_3Si_2$ gate electrodes. From the perspective of CMOS integration of Ni FUSI gates, the similar work function values and behavior of NiSi and $Ni_3Si_2$ gate electrodes suggest that formation of $Ni_3Si_2$ may be applied for applications targeting NiSi-like FUSI gates, implying a relaxation of the process control constraints due to the larger process window when considering the formation of FUSI gates with either NiSi or $Ni_3Si_2$ at the dielectric interface relative to the NiSi-only case.

$Ni_3Si_2$ FUSI gate electrodes can be formed by further reaction of $NiSi/Ni_2Si$ gate stacks. The work function of $Ni_3Si_2$ on $SiO_2$ and $HfSi_xO_y$ behaves similarly to NiSi in terms of work function values and of modulation with dopants on $SiO_2$, in contrast to Ni-rich silicides, which have significantly higher work function values on $HfSi_xO_y$ and negligible work function shifts with dopants on $SiO_2$. These results suggest that the electrode-dielectric interface is not modified significantly by the subsequent growth of $Ni_3Si_2$, maintaining similar characteristics to that of the original NiSi/dielectric interface, and imply that formation of $Ni_3Si_2$ may be tolerable for applications targeting NiSi FUSI gates, thereby expanding the process window.

Figure 5:
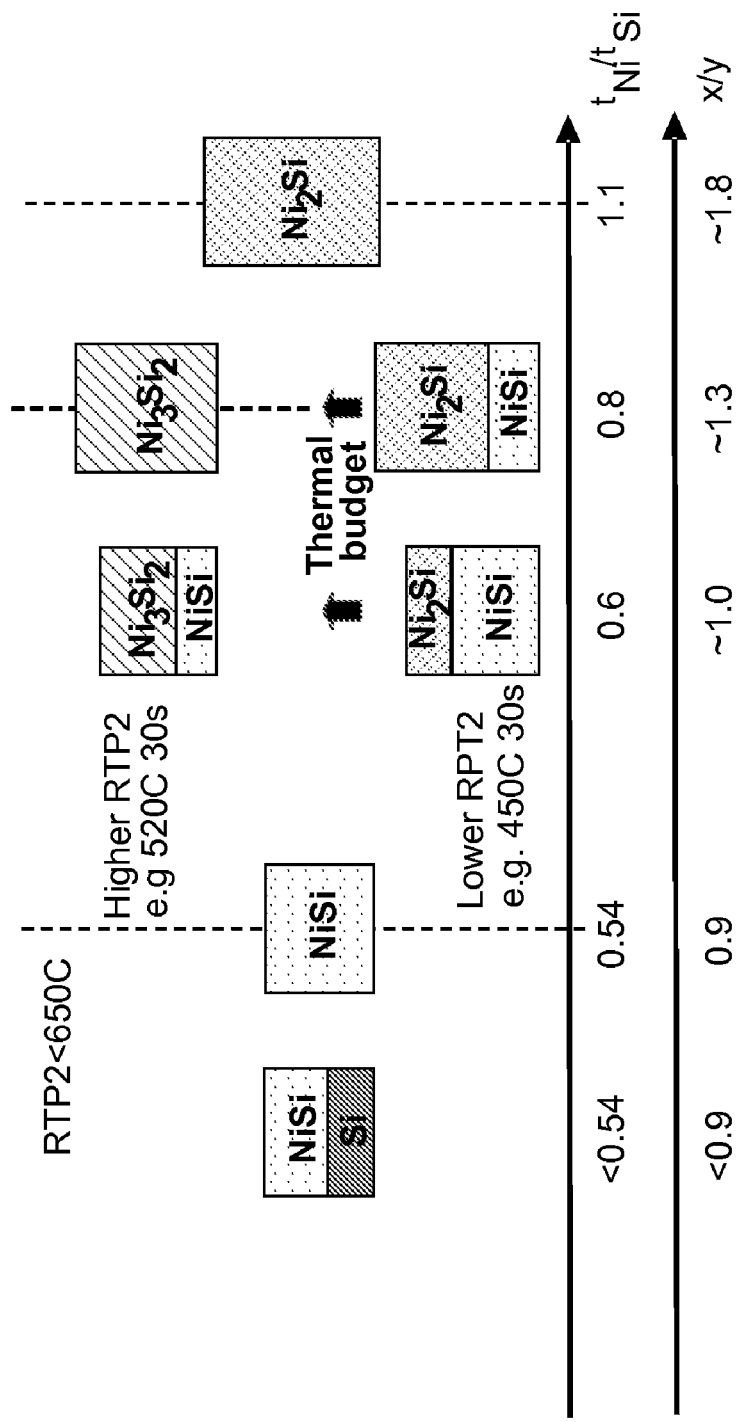
FIG. 5 shows the nickel silicide phase formation as function of the thermal budget of the second Rapid Thermal Processing (RPT2) step (temperature (° C.) for 30 s anneal time) and as function of ratio Ni-to-Si before silicidation, expressed as either thickness ratio ($t_{Ni}/t_{Si}$) or composition ratio (x/y).

As already indicated above, $Ni_3Si_2$ can be formed as a stable phase in the normal phase sequence for Ni-to-Si composition ratios x/y between 1 and 2. This is illustrated in FIG. 5 showing the nickel silicide phase formation as function of the thermal budget of the second RTP step (temperature (° C.) for 30 s anneal time) and as function of ratio Ni-to-Si, either thickness ($t_{Ni}/t_{Si}$) or composition (x/y) before silicidation.

If the ratio Ni-to-Si is selected between $0.55 < t_{Ni}/t_{Si} < 1$, ($0.9 < x/y < 1.8$), preferably between $0.6 < t_{Ni}/t_{Si} < 0.9$, ($1 < x/y < 1.6$), then the thermal budget of the first temperature step (RTP1) of the silicidation process is preferably chosen to form a stack of NiSi and $Ni_2Si$, the ratio between both silicide phases in the stack being determined by the thermal budget and nickel-to-silicon ratio. The higher the thermal budget of RTP1 and/or the more as-deposited nickel being available for silicidation during RPT1, the more $Ni_2Si$ is formed compared to NiSi. A method to select the nickel and silicon content of a silicided gate electrode by controlling the thermal budget of the first thermal step RPT1 of the silicidation process, is disclosed in United States patent application US 2006 0258156, hereby incorporated by reference in its entirety. If the thermal budget of the second temperature step (RTP2) of the silicidation process is selected to be high enough, e.g. RTP2>500° C. for 30 s, or temperature>425° C. for 60 minutes, the stack of NiSi and $Ni_2Si$ is partially or completely converted into $Ni_3Si_2$ layer thereby forming a $Ni_3Si_2$ silicide phase at least at the interface with the gate dielectric.

As discussed above, $Ni_3Si_2$ FUSI gates can be formed by further reaction of $NiSi/Ni_2Si$ gate stacks. $Ni_3Si_2$ behaves similarly to NiSi in terms of work function values, and of modulation with dopants on $SiO_2$, in contrast to Ni-rich silicides which have significantly higher work function values on $HfSi_xO_y$, and negligible work function shifts with dopants on $SiO_2$. Formation of $Ni_3Si_2$ can be applied for applications targeting NiSi FUSI gates, thereby expanding the process window without changing the electrical properties of the FUSI gate.

The advantage of using $Ni_3Si_2$ as a substitute for NiSi is illustrated by FIG. 6, showing the nickel silicide phase formation as function of the thermal budget of the first RTP1 step (temperature (° C.) for 30 s anneal time) and as function of composition ratio x/y Ni-to-Si. The thermal budget of the second thermal step RPT2 of the silicidation process was selected above 500° C. 30 s. In the prior art, the nickel-to-silicon ratio x/y is selected between 1 and 1.5 while the thermal budget of the first thermal step RTP1 was between 350° C. 30 s and 360° C. 30 s to form the predominant NiSi phase controlling the electrical properties of the gate electrode. During the second thermal step, a $Ni_3Si_2$ phase can be formed upon the NiSi phase at the interface with the gate dielectric. This NiSi process window is indicated in FIG. 6 with the dotted triangle. However, if the nickel to silicon ratio x/y is selected between 1.5 and 2 while the thermal budget of the first thermal step RTP1 was between 360° C. 30 s and 375° C. 30 s, a predominant $Ni_3Si_2$ phase at the interface with the gate dielectric is formed controlling the electrical properties of the gate electrode 5. As illustrated above, the $Ni_3Si_2$ phase will have work function properties similar to those of NiSi. Hence, the dashed triangle in FIG. 6 illustrates a process window wherein a similar work function behavior for a nickel fully silicided gate can be obtained as for a NiSi FUSI gate. This process window is adjacent to the process window for obtaining NiSi as predominant silicide phase determining the work function of nickel silicide. At the upper end of this range, illustrated by the dashed triangle, another metal rich phase $Ni_2Si$ may be formed upon the predominant $Ni_3Si_2$ phase in contact with the gate dielectric. Above this range metal-rich phases such as $Ni_2Si$ or $Ni_{31}Si_{12}$ will dominate the work function of the FUSI gate electrode thereby showing different work function properties compared to NiSi or $Ni_3Si_2$.

A method for fabricating a nickel fully-silicided-gate device is disclosed, the method comprising:
 providing a MOSFET device having a silicon gate electrode 5 formed on a gate dielectric 4,
 providing a nickel layer 12 in contact with said semiconductor gate electrode 5, and
 performing a silicidation process to form a $Ni_3Si_2$ silicide 15 at least at the interface with the gate dielectric 4.
In one embodiment, a silicidation process comprises:
 performing a first thermal process step to have the semiconductor gate electrode 5 react with the nickel 12 thereby forming a gate electrode stack comprising NiSi 13 and a metal-rich silicide phase 14, preferably $Ni_2Si$,
 selectively removing unreacted nickel (this NiSi process window is indicated in FIG. 6 with the dotted triangle 12), and
 performing a second thermal process step to have the gate electrode stack comprising NiSi 13 and a metal-rich silicide phase 14, preferably $Ni_2Si$, converted into a $Ni_3Si_2$ silicide phase 15 at least at the interface with the gate dielectric 4.

Preferably after the first thermal step the gate electrode comprises a stack of NiSi 13 in contact with the gate dielectric 4 and $Ni_2Si$ 14 in contact with the NiSi 13. Preferably this silicide stack 13, 14 is fully converted in $Ni_3Si_2$ silicide 15.

FIGS. 7a-d illustrate by means of cross-sectional views this method of fabricating a nickel fully-silicided-gate device comprising a $Ni_3Si_2$ silicide phase 15 at least at the interface with the gate dielectric 4.

Figure 7A:
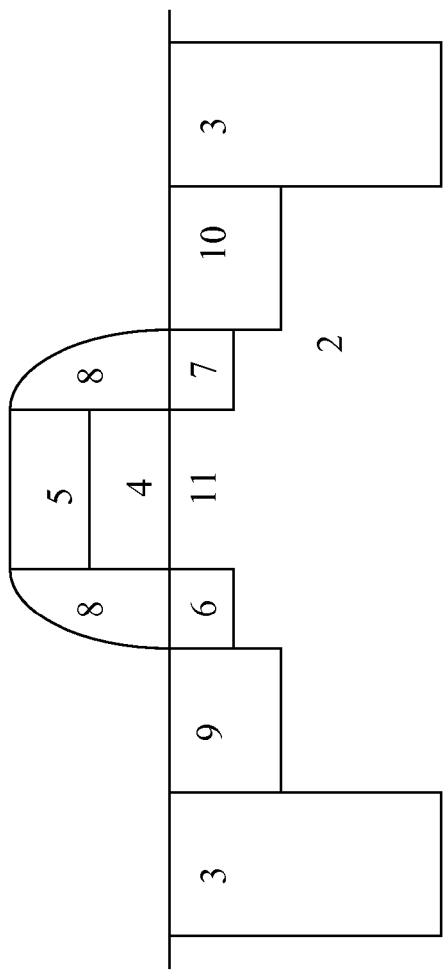
FIGS. 7a-d show schematic cross-sections of a device illustrating different steps in a fabrication process.

FIG. 7a shows a schematic cross-sectional view of Metal-Oxide-Semiconductor Field Effect Transistor (MOSFET). The MOS device 1 comprises a gate stack formed on a semiconducting layer or substrate 2. The gate stack comprises a gate dielectric 4 in contact with this semiconducting layer 2 and a gate electrode 5 in contact with this gate dielectric 4. The gate dielectric can be a silicon-oxide, a silicon-oxy-nitride ($Si_xO_yN_{1-x-y}$), a high-k dielectric (k>3.9) such as Hafnium or Aluminum silicates or oxides, e.g. $HfO_2$, $Al_2O_3$. Preferably the gate dielectric 4 is a silicon-oxide or a Hafnium-based dielectric, such as $HfSi_xO_y$. The gate electrode 5 comprises a semiconductor layer comprising Si, Ge or SiGe. This semiconductor layer is preferably silicon. This silicon can be in a monocrystalline, polycrystalline or amorphous state. The thickness of the semiconductor gate electrode 5, representing the amount of semiconductor material available, can be determined in view of the desired composition of the later-formed silicide. The MOS device can further comprise spacers 8 formed adjacent the gate stack 4, 5. Spacers can be formed from silicon-oxide, silicon-oxy-nitride ($Si_xO_yN_{1-x-y}$), silicon nitride, silicon carbide or from a combination of these materials. At opposite sides of this gate stack 4, 5 source/drain junction regions are formed, typically as a combination of lower doped extension regions 6, 7 underneath the spacers 8 and higher doped connection regions 9, 10 adjacent these extension regions and aligned to the spacers 8. Dielectrically coupled to the gate stack, a channel region 11 is present in the semiconductor layer 2, which in this case is the semiconductor substrate itself 2. The active area region (not indicated) in which the transistor 1 is formed, is separated from other active area regions by so-called field regions 3 formed by known techniques such as Local Oxidation of Silicon (LOCOS) or Shallow Trench Insulation (STI).

Figure 7B:
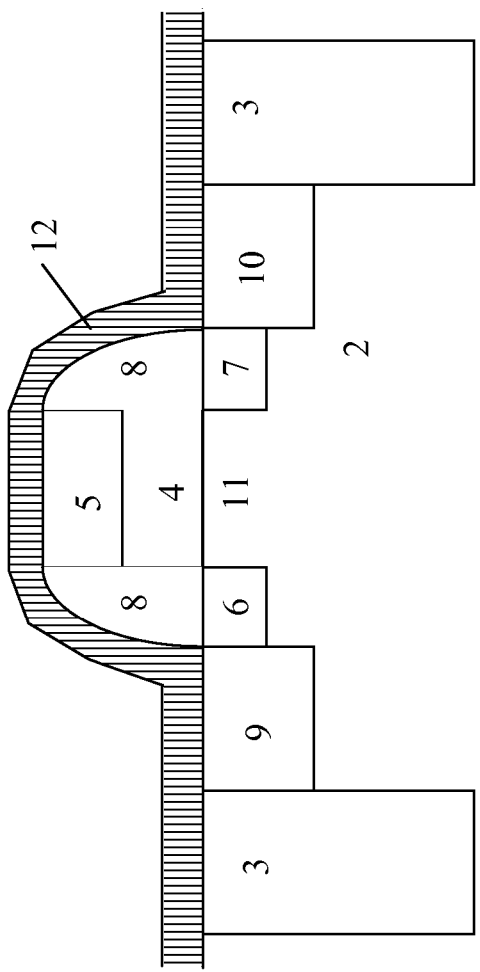

FIG. 7b shows a schematic cross-sectional view of the semiconductor device 1 after the nickel layer 12 deposited overlying the substrate. The nickel layer 12 is in contact with the exposed semiconductor gate electrode 5 and, in this example, with the exposed regions of the semiconductor layer 2.

Figure 7C:
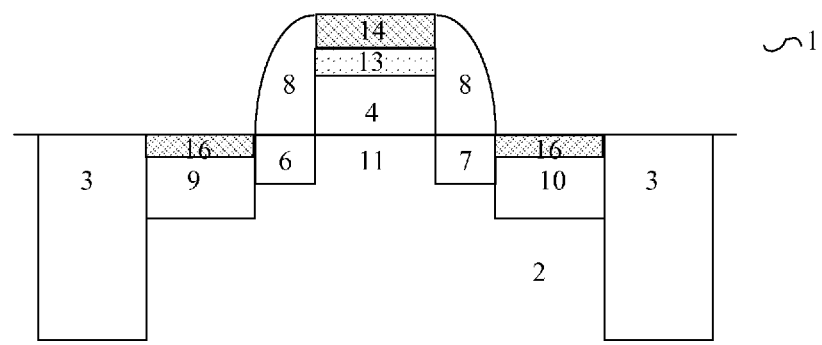
Figure 7D:
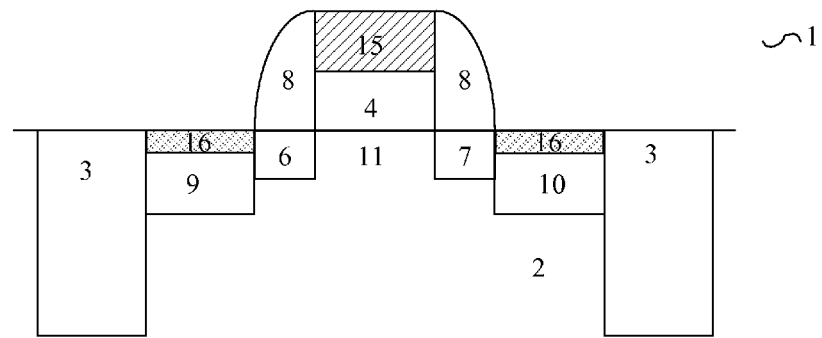

FIG. 7c shows a schematic cross-sectional view of the semiconductor device 1 after the first thermal step and selective etch of the silicidation process. A first thermal process step is performed using Rapid Thermal Processing (RTP) to have the nickel 12 react with the contacted semiconductor material 5. Silicide 16 will form in the connection regions 9, 10 and a stack of NiSi 13 and $Ni_2Si$ 14 is formed in the gate electrode 5. Different sources of thermal energy known in the art, such as spike anneal, laser anneal, and furnace anneal can be applied to provide the thermal budget of the first thermal step. The nickel 12 to silicon 5 ratio x/y is selected between 1 and 2, preferably between 1.5 and 2, while the thermal budget of the first thermal step RTP1 is selected between 360° C. 30 s and 380° C. 30 s. After the first thermal treatment step the remaining unreacted metal 12 is selectively removed, preferably by a wet etch, e.g. of about 5 minutes, e.g. using dilute $HNO_3$. In particular any excess metal present near the MOSFET device will also be removed during this removal step.

Thereafter, a second thermal process step is performed to convert the $NiSi/Ni_2Si$ stack 13, 14 in a stack comprising $Ni_3Si_2$ 15 at least at the interface with the gate dielectric 4. The thermal budget of the second thermal step RTP1 is preferably above 500° C. 30 s.

The invention claimed is:

1. A method of fabricating a nickel fully-silicided-gate electrode device, the method comprising:
    providing a metal-oxide-semiconductor field-effect transistor (MOSFET) device having a semiconductor gate electrode formed on a gate dielectric;
    providing a nickel layer in contact with the semiconductor gate electrode;
    performing a silicidation process to form a $Ni_3Si_2$ silicide at least at an interface between the semiconductor gate electrode with the gate dielectric; and
    incorporating a dopant in the $Ni_3Si_2$ silicide to modulate a work function thereof.

2. The method of claim 1, wherein the dopant is selected from the group consisting of phosphorous and boron.

3. A method of fabricating a nickel fully-silicided-gate electrode device, the method comprising:
    providing a metal-oxide-semiconductor field-effect transistor (MOSFET) device having a semiconductor gate electrode formed on a gate dielectric;
    providing a nickel layer in contact with the semiconductor gate electrode; and
    performing a silicidation process to form a $Ni_3Si_2$ silicide at least at an interface between the semiconductor gate electrode with the gate dielectric, wherein the silicidation process comprises:
        performing a first thermal process step to react the semiconductor gate electrode with the provided nickel to form a gate electrode stack comprising NiSi and a metal-rich silicide phase;
        selectively removing unreacted nickel; and
        performing a second thermal process step to convert the gate electrode stack comprising NiSi and a metal-rich silicide phase into a $Ni_3Si_2$ silicide phase.

4. The method of claim 3, wherein the metal-rich silicide phase is $Ni_2Si$.

5. The method of claim 3, further comprising incorporating a dopant in the $Ni_3Si_2$ silicide to modulate a work function thereof.

6. The method of claim 5, wherein the dopant is selected from the group consisting of phosphorous and boron.

7. The method of claim 1, wherein the gate dielectric is a silicon-oxide.

8. The method of claim 1, wherein the gate dielectric is a hafnium-based high-k dielectric.

9. The method of claim 3, wherein the gate dielectric is a silicon-oxide.

10. The method of claim 3, wherein the gate dielectric is a hafnium-based high-k dielectric.

11. A method of fabricating a metal-oxide semiconductor (MOS) device, the method comprising:
    providing a gate stack formed on a substrate, wherein the gate stack comprises a gate dielectric in contact with the substrate and a silicon gate electrode in contact with the gate dielectric;
    depositing a nickel layer on the silicon gate electrode;
    in a first thermal process step, thermally treating the gate electrode stack such that the nickel layer and the silicon gate electrode react to form a stack comprising NiSi and a metal-rich silicide phase;
    after the first thermal process step, selectively removing unreacted nickel;
    in a second thermal process step, after the selective removal of unreacted nickel, thermally treating the gate electrode stack such that the NiSi and the metal-rich silicide phase are converted into a $Ni_3Si_2$ silicide phase at least at an interface between the gate electrode and the gate dielectric.

12. The method of claim 11, wherein the metal-rich silicide phase comprises $Ni_2Si$.

13. The method of claim 11, wherein the first thermal process step has a first thermal budget of between about 360° C. and 30 seconds and about 380° C. and 30 seconds.

14. The method of claim 11, wherein the second thermal process step has a second thermal budget of above about 500° C. and 30 seconds.

15. The method of claim 12, wherein:
    the first thermal process step has a first thermal budget of between about 360° C. and 30 seconds and about 380° C. and 30 seconds; and
    the second thermal process step has a second thermal budget of above about 500° C. and 30 seconds.

16. The method of claim 11, further comprising doping the gate electrode to modulate a work function thereof.

17. A metal-oxide-semiconductor field-effect transistor (MOSFET) comprising a gate electrode and a gate dielectric, wherein the gate electrode comprises $Ni_3Si_2$ at least at an interface with the gate dielectric.

18. The MOSFET of claim 17, wherein the $Ni_3Si_2$ further comprises a dopant for modulating the work function thereof.

19. The MOSFET of claim 18, wherein the dopant is selected from the group consisting of phosphorous and boron.

* * * * *